United States Patent
Chen

(10) Patent No.: US 8,354,654 B2
(45) Date of Patent: Jan. 15, 2013

(54) APPARATUS AND METHOD FOR ION BEAM IMPLANTATION USING SCANNING AND SPOT BEAMS WITH IMPROVED HIGH DOSE BEAM QUALITY

(75) Inventor: Jiong Chen, San Jose, CA (US)

(73) Assignee: Kingstone Semiconductor Company (CN)

( * ) Notice: Subject to any disclaimer, the term of this patent is extended or adjusted under 35 U.S.C. 154(b) by 489 days.

(21) Appl. No.: 12/661,522

(22) Filed: Mar. 18, 2010

(65) Prior Publication Data
US 2010/0237232 A1 Sep. 23, 2010

Related U.S. Application Data

(60) Provisional application No. 61/210,447, filed on Mar. 18, 2009.

(51) Int. Cl.
*H01J 37/317* (2006.01)
(52) U.S. Cl. .................... 250/492.21; 250/396 R
(58) Field of Classification Search ............ 250/492.21, 250/396 R
See application file for complete search history.

(56) References Cited

U.S. PATENT DOCUMENTS 7,897,943 B2 * 3/2011 Purser et al. ............ 250/492.21
8,044,375 B2 * 10/2011 Chen ...................... 250/492.21

* cited by examiner

*Primary Examiner* — Kiet T Nguyen
(74) *Attorney, Agent, or Firm* — Bo-In Lin

(57) ABSTRACT

An ion implantation apparatus with multiple operating modes is disclosed. The ion implantation apparatus has an ion source and an ion extraction means for forming a converging beam on AMU-non-dispersive plane therefrom. The ion implantation apparatus includes magnetic scanner prior to a magnetic analyzer for scanning the beam on the non-dispersive plane, the magnetic analyzer for selecting ions with specific mass-to-charge ratio to pass through a mass slit to project onto a substrate. A rectangular quadruple magnet is provided to collimate the scanned ion beam and fine corrections of the beam incident angles onto a target. A deceleration or acceleration system incorporating energy filtering is at downstream of the beam collimator. A two-dimensional mechanical scanning system for scanning the target is disclosed, in which a beam diagnostic means is built in.

17 Claims, 5 Drawing Sheets

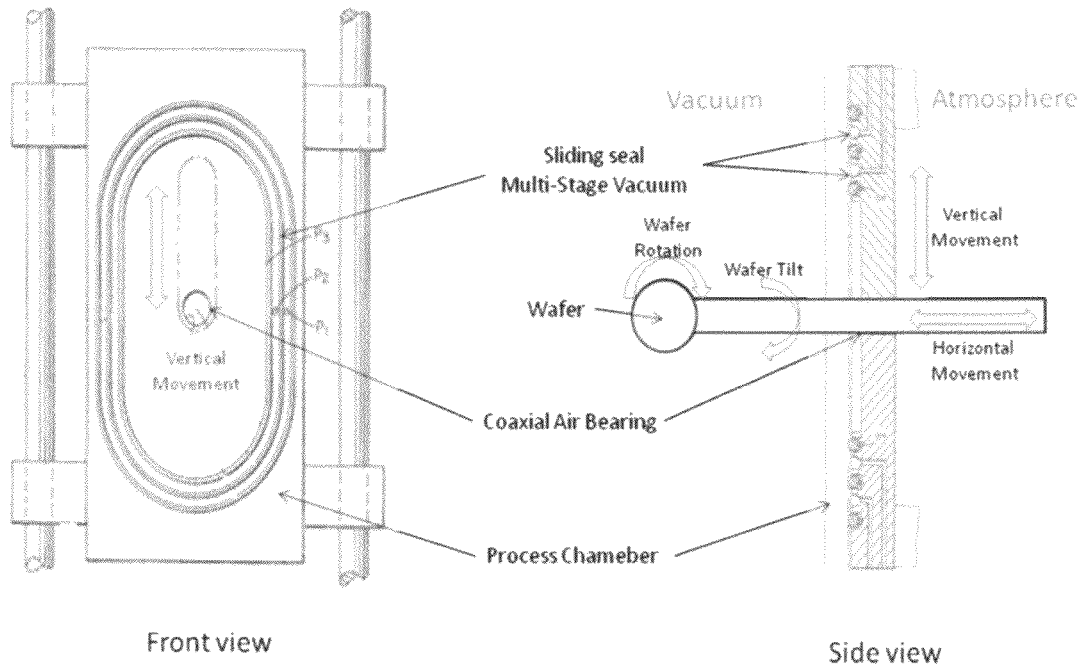
Front view
Fig. 7A
Side view
Fig. 7B
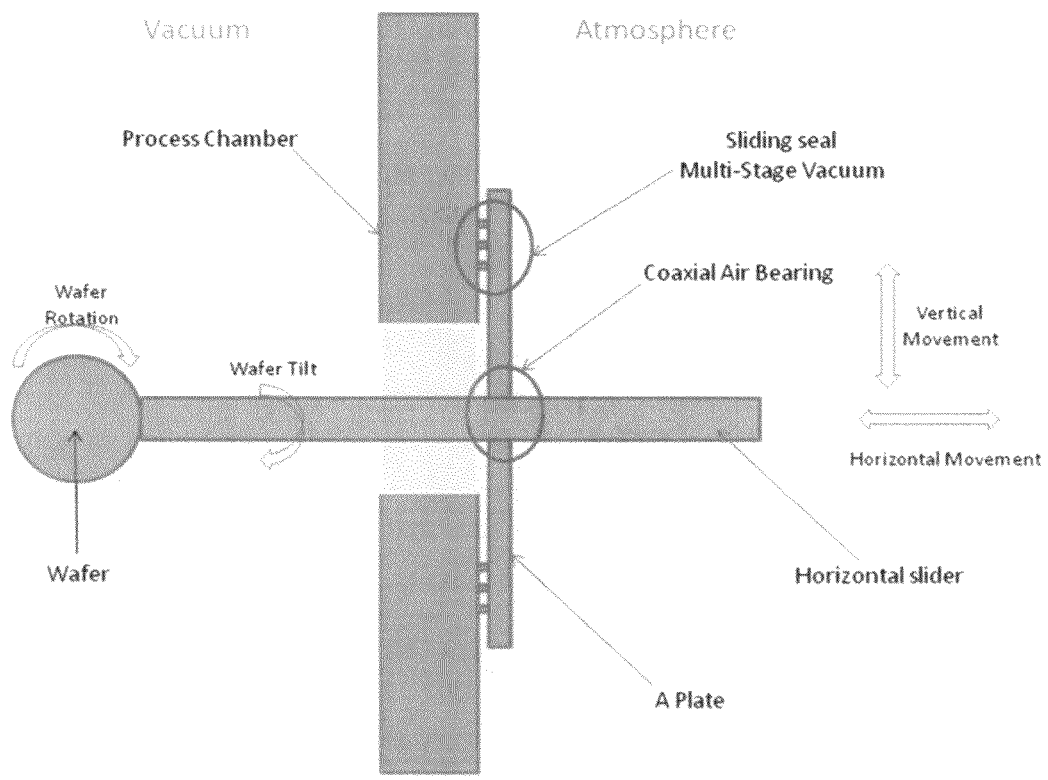
Fig. 7C

APPARATUS AND METHOD FOR ION BEAM IMPLANTATION USING SCANNING AND SPOT BEAMS WITH IMPROVED HIGH DOSE BEAM QUALITY

The Non-Provisional Application claims a Priority Date of Mar. 18, 2009 benefited from a Provisional Application 61/210,447 filed by a same Applicant of this Non-Provisional Application. The disclosures made in Provisional Application 61/210,447 are hereby incorporated by reference in this Non-Provisional Application.

FIELD OF THE INVENTION

The invention relates generally to apparatuses and methods of ion implantation. More particularly, this invention relates to improvements of ion implantation controls in ion beam incident angles, dose accuracy, implantation apparatus productivities at a wide range of ion energies from few hundreds of eV to several tens of keV and further improving the high dose implant qualities of the scan beams.

BACKGROUND OF THE INVENTION

High dose ion implants require high ion beam currents in order to maintain high implanter productivity. In the advanced technology integrated circuit fabrications, very low energy and high beam current implants are essential. Accurate implant angle and dose uniformities are becoming more and more critical as the technology nodes move towards 45 and 32 nm. However, prior arts ion implanter technologies cannot meet these requirements. Perveance is a term represents combination effects of ion beam current and energy on the beam transportation. The higher the ion beam current and the lower the ion energy are the larger is the Perveance value.

The large Perveance beam tends to be blowup during its transportation. Any electrostatic potential exists in the beamline that is for ion beam generation and transportation can severely limit beam currents to a target. This is because the potential push electrons inside the beam away to result positive space charges in the beam. The beam electrons are produced when energetic ions interact with the beamline residual gas atoms or molecular and they are trapped inside the ion beam to keep the ion beam positive space charge very low. Large space charges can be resulted if these electrons are stripped away from the beam. The positive space charges of ions tend to push the ions move laterally. The beam size can be quickly increased as it propagates so that the partial beam hits on the physical boundary of the beamline system before the beam reaches a target. Therefore, for a high perveance ion beam transportation it prohibits any electrostatic scanning mechanism, magnetic scans or stationary beams are used.

FIG. 1 shows a type of ion implantation system for silicon wafers and that is represented by the Models SHC 80, VIISta-80, and VIISta HC ion implantation systems manufactured by Varian Semiconductor Equipment Associates of Gloucester, Mass. This system is illustrated and adapted from FIG. 1 of U.S. Pat. No. 5,350,926. The disclosures made in U.S. Pat. No. 5,350,926 are hereby incorporated by reference. The system comprises an ion source 2 for generating an ion beam 1, an analyzing electromagnet 3, a resolving aperture 4, and a second electromagnet 5. A control unit 36 receives beam intensity information on line 36a from a beam profiler and sends control signals along line 36b to control multipole elements in magnet 3 or along line 36c to control a beam trimmer. Magnet 3 mass analyzes the ion beam. Magnet 5 expands the beam along the dispersive plane using magnetic fields in closed loop control to maintain the uniformity of the beam. The result is a ribbon-shaped ion beam 6 that is incident on target 7. Further details of the system of FIG. 2 are set forth in U.S. Pat. No. 5,350,926.

The major issue of this approach in generating and employing a ribbon beam is that the ribbon beam cannot be generated with uniform implant angle and also provide uniform implant dose. The beam intensity must be uniform in one direction. This beam intensity uniformity is obtained by moving some beam from high intensity regions to lower intensity regions so that the beam angle integrity is sacrificed because of beam intensity adjustments.

Another U.S. Pat. No. 5,132,544 discloses a system as that shown in FIG. 2 for irradiating the surface of a substrate with atomic or molecular ions by rapid scanning of a beam in two dimensions over the surface of the substrate. A scanning system is shown for deflecting the beam in two dimensions relative to a reference axis and a magnetic ion beam transport system following the scanning system is arranged to receive the beam from the scanning system over the range of two dimensional deflections of the scanning system and constructed to impose magnetic field conditions along the beam path of characteristics selected to reorient the two-dimensionally deflected beam to a direction having a predetermined desired relationship with the axis in the two dimensions at the desired instantaneous two dimensional displacement of the beam from the axis, to produce the desired scan of the beam over the substrate. One scanning system includes sequential first and second time-variable-field magnetic scanners, the first scanner having a magnetic gap of volume smaller than that of the second scanner and constructed to scan the beam more rapidly than the second scanner. In another system, the scanners are superposed. The magnetic ion beam transport system presently preferred is a system producing a sequence of three or more quadrupole fields, implemented by a sequence of quadrupoles. Alternate structures are disclosed. The system is capable of depositing atomic or molecular ions with a desired angular and positional uniformity over a wide range of perveance including perveance above $0.02/M[amu]^{1/2}$ $(mA//keV^{3/2})$ with a constant, adjustable spot size and small beam spread.

In this approach the major problem is that beamline needs a lot of magnetic lens in order to make beam shape is proper for its magnetic scanning to work. Therefore, the beamline is very long for a beam's transportation. The lower beam currents are resulted because of long travel distances.

In another U.S. Pat. No. 7,235,797, an implanter is disclosed as shown in FIG. 3 that provides two-dimensional scanning of a substrate relative to an implant beam so that the beam draws a raster of scan lines on the substrate. The beam current is measured at turnaround points off the substrate and the current value is used to control the subsequent fast scan speed so as to compensate for the effect of any variation in beam current on dose uniformity in the slow scan direction. The scanning may produce a raster of non-intersecting uniformly spaced parallel scan lines and the spacing between the lines is selected to ensure appropriate dose uniformity.

FIG. 4 illustrates the problems of this beam scanning process. The target has to have mechanical scans in two directions. A lot of beam has to be implanted outside the target due to two-dimensional over scans. Especially, when the beam height is smaller than wafer diameter, two-dimensional mechanical scans with a wafer is held on a robot type of object that can move left/right and up/down to form beam implanted pattern must be carried out. In order to have sufficiently good implanted dose uniformity it needs many scans, which will require longer implant time. Also, mechanical turnaround in reciprocal motion can result a lot implant dead time. Therefore, this beam scanning process has very poor ion beam utilization and low productivities thus causing higher production costs and unnecessary wastes of energy and manufacturing resources.

For these reasons, there is a need in the art of integrated circuit fabrication to provide a new system to resolve the above-discussed difficulties. Specifically, there is a need for a new and improved systems to resolve the problems of the conventional types of ion implantation systems by providing a viable solution for perforthing one wafer at a time implantation with a high-current, high dose and angle uniformities.

SUMMARY OF THE PRESENT INVENTION

It is an aspect of the present invention to provide a new and improved beam scanning system for carrying out the ion implant operation with a high current implantation with improved dose uniformity without sacrificing the implantation angle uniformity while reducing the production cost and simplifying the manufacturing processes.

Specifically, it is an aspect of the present invention to provide a new and improved beam scanning system for carrying out the ion implant operation with the ion beams magnetically scanned in a non-dispersive plane so that the unnecessary beamline components can be eliminated. The beam scan operation can be carried out with a short beamline and higher beam currents transported in a low energy.

It is a further aspect of the present invention to provide a new and improved beam scanning system for carrying out the ion implant operation with flexibility to fine tune the implant angle by fine tuning Panofky coil currents. Since the beam can be flexibly controlled to transmit to different positions, the current on the Panofky coil can be adjusted to fine tune the beam incident angle based on the required beam implant angles. Precise control of the implant angles can be more conveniently and more accurately achieved.

It is a further aspect of the present invention to provide a new and improved beam scanning system for carrying out the ion implant operation with improved implant dose uniformity. The dose uniformity can be more conveniently achieved by, first measuring the beam currents at different scan positions; second, decide scan velocity profile based on measured beam currents along the scan positions; third, implant the target at this scan velocity profile. Therefore, precise control of the implant dose uniformity can be more conveniently and more accurately achieved.

It is a further aspect of the present invention to provide a new and improved beam scanning system for carrying out the ion implant operation with improved beam utilization by applying a beam scanning system to perform the beam scanning operation with a beam controllable to have a high speed and quick turnaround operation.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 7A and 7B are a front view and a side view to show the operation of the apparatus. FIG. 7C shows details of the configuration and the movements of the mechanical parts of the system.

DETAILED DESCRIPTION OF THE PREFERRED EMBODIMENTS

Figure 1:
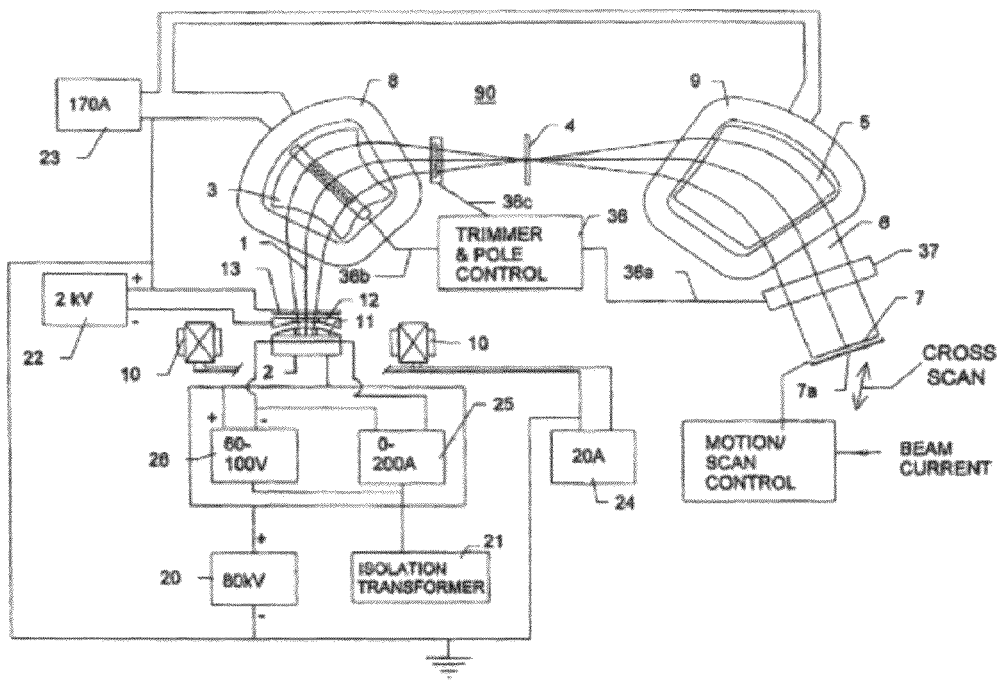
FIG. 1 is a functional block diagram of a conventional ion implantation system.
Figure 2:
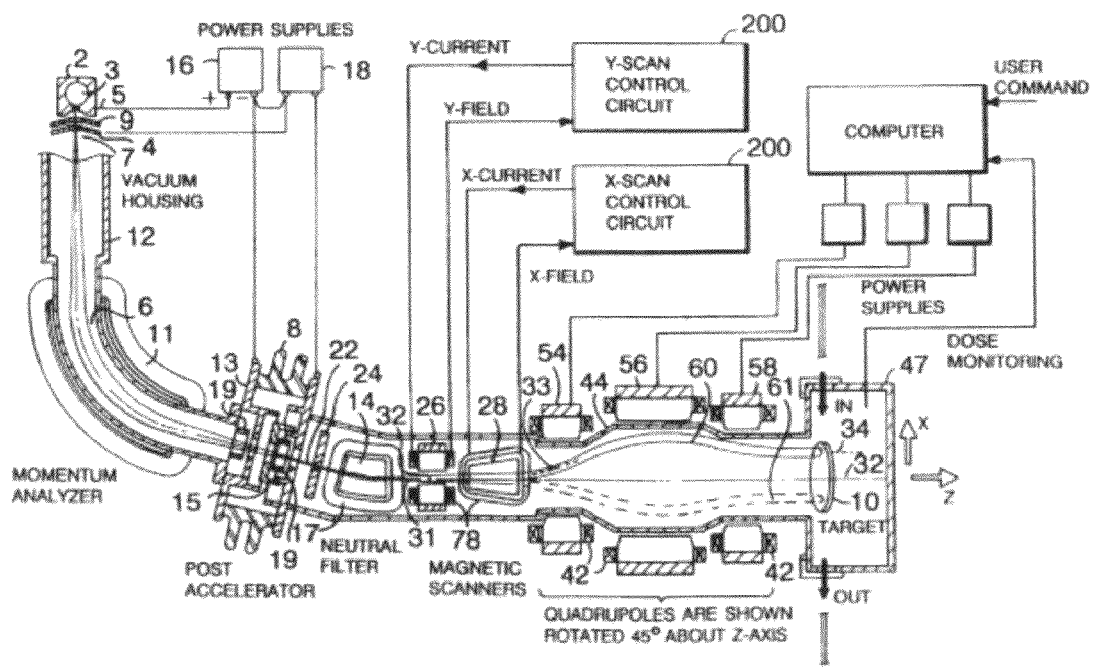
FIG. 2 is a functional block diagram for showing the beam paths and control processes of a conventional implantation system.
Figure 3:
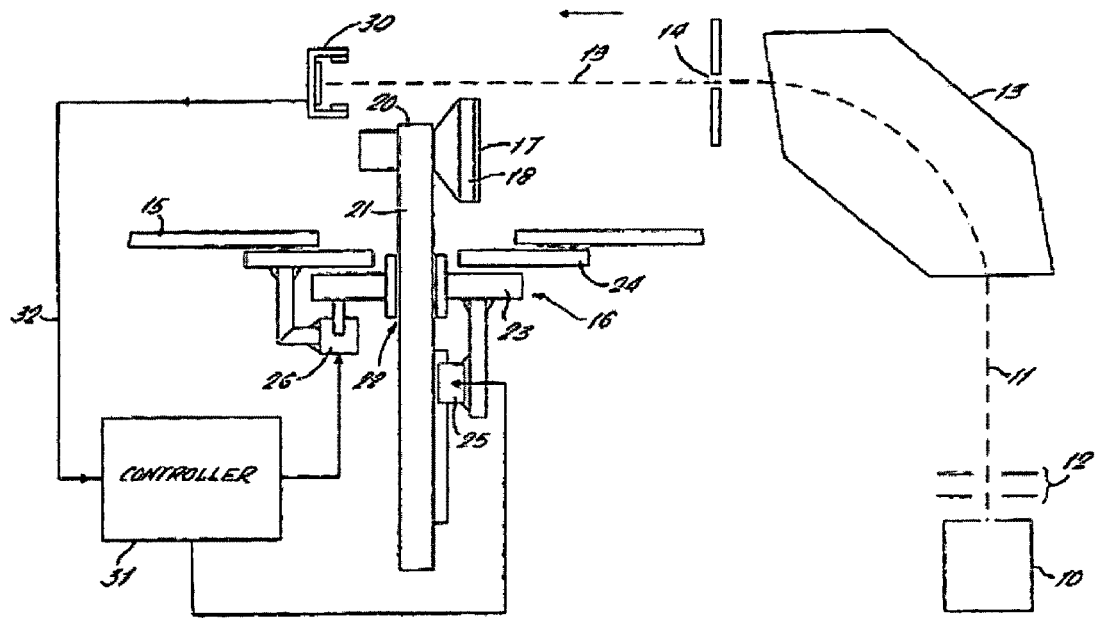
FIG. 3 depicts the beam path and control of another prior art disclosure.
Figure 4:
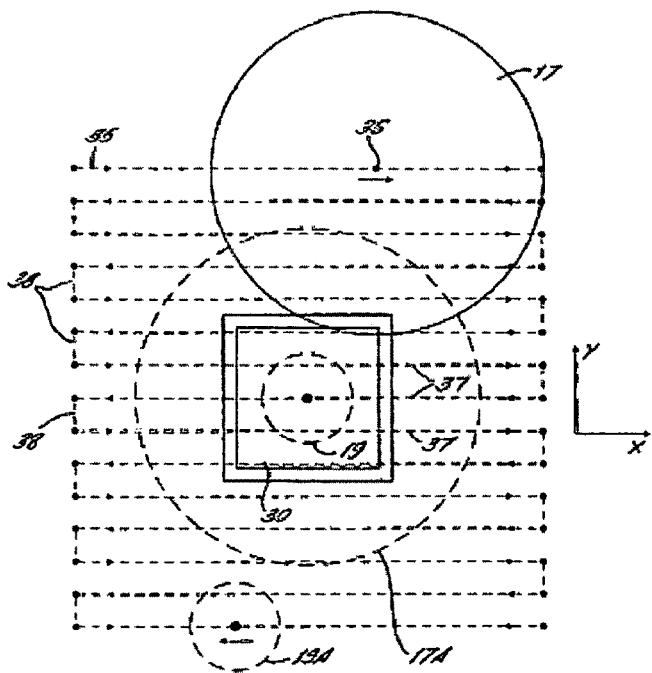
FIG. 4 depicts the beam cross sections according to the beam control process of FIG. 3.
Figure 5:
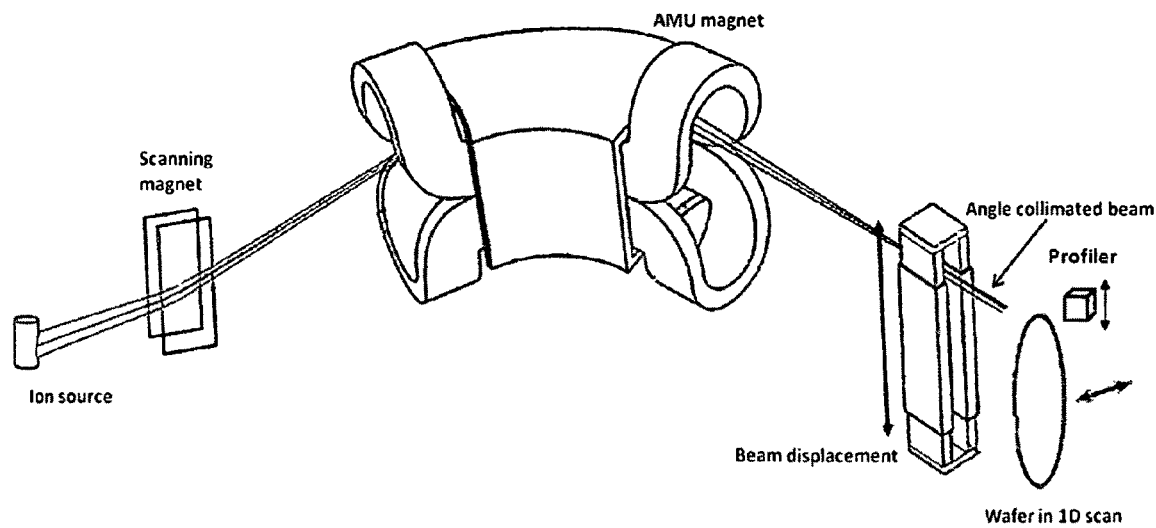
FIG. 5 is a perspective view of a scanned-beam system of this invention that includes a scan beam mechanism before the AMU magnet with a small angle and large beam displacement.

FIG. 5 is a perspective view of a first embodiment of an ion implantation system of the present invention. The system comprises an ion source that produces an ion beam that emanates from a divergent extraction optics, a scan magnet, a mass analyzer magnet, and a rectangular quadrupole magnet. The scan mechanism is before the AMU magnet. A Small scan angle range can get large beam displacement. As will be appreciated by those skilled in the art, these elements are housed in a vacuum enclosure (not shown). The mass analyzer magnet is large pole-gap window-frame dipole. The details of the analyzer magnet are described in U.S. Pat. Nos. 5,736,743 and 6,403,967 and the disclosures made in these patents are hereby incorporated by reference in this patent application. The scan magnet scans the beam by controlling the scan magnet coil current. The beam is scanned slower where a measurement of beam current is smaller and faster where the beam current is higher. By applying such control, a uniform beam is generated without requiring beamlet angle changes.

Figure 6:
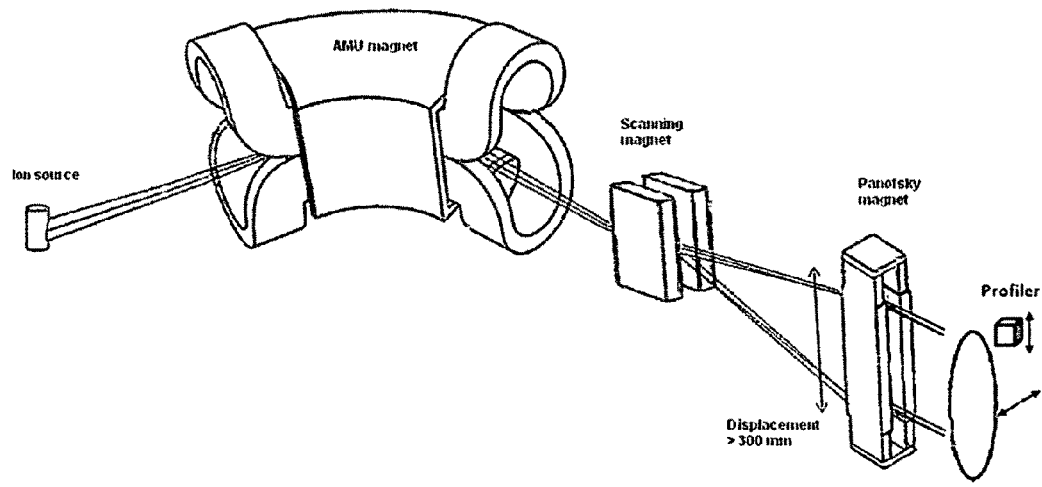
FIG. 6 is a perspective view of a beam scanning system that has a beam scanning mechanism disposed after the AMU of this invention that has a larger scan angle and stronger collimation of the scanning beam.

FIG. 6 is a perspective view of a beam scanning system that has a beam scanning mechanism disposed after the AMU of this invention that has a larger scan angle and stronger collimation of the scanning beam. The scanning magnet is located after AMU magnet and the scan angle is larger than the beam scanning system shown in FIG. 5 with a stronger collimator in order to collimate the scanned beams. The wafer (or target) is mechanically translated horizontally through the vertically scanned beam. The scanning beam is controlled for scanning the target through the ion beam horizontally (x-direction). Therefore, this invention discloses ion implantation apparatus and method for irradiating a surface with large perveance ion beams using magnetic and mechanical scanning.

This system can tune the beam current uniformity and beam angle separately. Implant dose uniform control will not change implant angles. Therefore, both implant dose and angle uniformity can be maintained. The rectangular quadrupole magnet is used for the beam angle tuning. The scan magnet coil currents can be adjusted to change beam scan speed based on beam currents measured in positions relative to wafer positions. Improvements of the implanted dose uniformity can be achieved with shorter beamline length. As the beam is scanned in the divergent direction, the scanned beam range will be greater than the diameter of the wafer. It only needs one-dimensional mechanical wafer scan to have the wafer crossed the beam. In the one-dimensional mechanical scan case the minimum scan number required for a uniform implant is much smaller than two-dimensional mechanical scan. Therefore, the implant time is less and throughput is improved.

Figure 7:
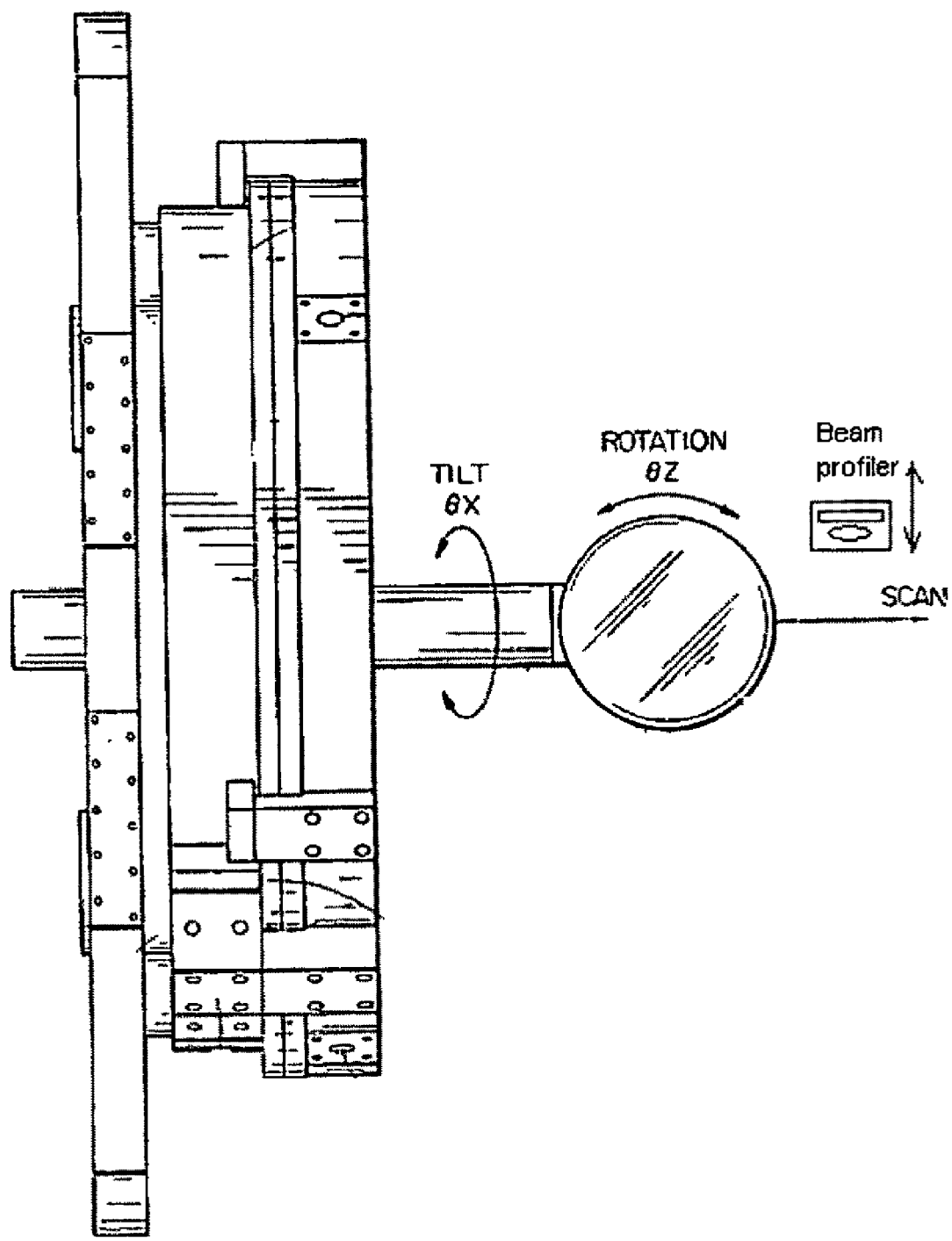
FIG. 7 shows a side cross sectional view of an apparatus for scanning the target through the ion beam in either one or two dimensions.

FIG. 7 shows a side cross sectional view of an apparatus for scanning the target through the ion beam in either one-dimensional or two dimensional modes. Compared to other implanter's mechanical scan systems, this apparatus is very simple and cost effective. It only need a sliding seal (Y-scan) and an air bearing (X-scan and tilt) to meet the needs of one-dimensional mechanical scan and two-dimensional mechanical scan vacuum seals. Sliding seal is very mature technology, and there are more than 3000 implanter systems which use this type of vacuum seals. The coaxial air bearings are commercial items. FIGS. 7A and 7B are a front view and a side view to show the operation of the apparatus. The details of the configuration and the movements of the mechanical parts of the system are shown in FIG. 7C.

This invention further discloses an ion implantation apparatus and method that have an ion source and an ion extraction device for extracting an ion beam. The ion implantation apparatus includes an ion beam scanner that is placed immediately next to the ion extraction device. The ion implantation apparatus further includes a magnetic analyzer for selecting ions with specific mass-to-charge ratio to pass through a mass slit. A rectangular magnetic quadrupole is disposed between the mass analyzer exit and the target to collimated and correct the angles of the ion beams. A mechanical scanning means transverses the target through the ion beams.

Although the present invention has been described in terms of several embodiments, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. An ion implantation apparatus for implanting a substrate, by irradiating a surface of the substrate with a high perveance ion beam by rapid scanning of the ion beam in one direction and slower mechanical scanning in another direction over the substrate, the apparatus including:
    an ion source and associated beam-forming devices for producing a high perveance beam of desired ions,
    a magnetic scanning system for scanning the ion beam in a vertical plane,
    a mass analyzer,
    a rectangular magnetic quadrupole for collimating and focusing the scanned ion beam,
    deceleration electrodes to reduce the ion beam energy,
    an end station for scan a substrate in one direction that is nearly transverse to the ion beam, and
    an ion beam intensity and angle profile measurement device on the substrate scan plane.

2. The apparatus of claim 1, wherein the ion source and associated beam-forming devices generate a spot beam on the substrate plane.

3. The apparatus of claim 1, wherein the magnetic scanning system is before the mass analyzer and scanning the ion beam is in a non-dispersive plan, and a magnetic field in the mass analyzer is aligned generally with the scanning direction.

4. The apparatus of claim 3, wherein the magnetic scanning system can park the ion beam outside the substrate per implantation control requests.

5. The apparatus of claim 1, wherein the mass analyzer is a large pole gap dipole magnet where ions in the beam are dispersed into multiple paths according to the mass to charge ratios in horizontal plane.

6. The apparatus of claim 1, wherein the rectangular magnetic quadrupole is Panofsky's magnets.

7. The apparatus of claim 1, wherein the ion beam deceleration electrodes have both ion beam deceleration and energy filtration functions.

8. The apparatus of claim 1, wherein the mechanical scanning for traversing the substrate through the ion beam scans the substrate in a direction nearly perpendicular to the scanned ion beam.

9. An ion implantation apparatus for implanting a substrate, by irradiating a surface of the substrate with a high perveance ion beam by rapid scanning of the ion beam in one direction and slower mechanical scanning in another direction over the substrate, the apparatus including:
    an ion source and associated beam-forming devices for producing a high perveance beam of desired ions,
    a mass analyzer,
    a magnetic scanning system for scanning the ion beam in a non-dispersive plane,
    a rectangular magnetic quadrupole for collimating and focusing the scanned ion beam,
    deceleration electrodes to reduce the ion beam energy,
    an end station for scan a substrate in one or two directions that are nearly transverse to the ion beam, and
    an ion beam intensity and angle profile measurement device on the substrate scan plane.

10. The apparatus of claim 9, wherein the ion source and associated beam-forming devices generate a spot beam on the substrate plane.

11. The apparatus of claim 9, wherein the mass analyzer is a dipole magnet where ions in the beam are dispersed into multiple paths according to the mass to charge ratios in horizontal plane.

12. The apparatus of claim 9, wherein the magnetic scanning system is after the mass analyzer and scanning the ion beam is in a non-dispersive plan, and a magnetic field in the mass analyzer is aligned generally with the scanning direction.

13. The apparatus of claim 12, wherein the magnetic scanning system can park the ion beam outside the substrate per implantation control requests.

14. The apparatus of claim 9, wherein the rectangular magnetic quadrupole is Panofsky's magnets.

15. The apparatus of claim 9, wherein the ion beam deceleration electrodes have both ion beam deceleration and energy filtration functions.

16. The apparatus of claim 9, wherein the mechanical scanning for traversing the substrate through the ion beam scans the substrate in a direction nearly perpendicular to the scanned ion beam.

17. A method for irradiating a high perveanse ion beam on a substrate with dose and angle uniformities comprising the steps of:
    a) providing a dipole magnetic scanning unit, a Panofsky rectangular quadrupole magnet, and an ion beam intensity and angle profile measurement device with respective scanning coils and respective Panofsky coils;
    b) generating an ion beam and passing it into an ion implant system with sequences: the dipole magnetic scanning unit, the Panofsky rectangular quadrupole magnet, and the ion beam intensity and angle profile measurement device;

c) Presetting Panofsky coil currents at nominal values so that scanned ion beam angles are nominally parallel on the substrate plane;
d) scanning the ion beam over a range that is greater a particular substrate dimension, beam scanning velocity profile can be arbitrated;
e) measuring beam angle profiles across a completed scanning region and sending the beam angle profiles into a computer;
f) calculating Panofsky coil current setting profiles along the beam scanning direction based on the beam angle profiles and characteristics of ion beam line;
g) scanning the beam and dynamically varying the Panofsky coil current values according to scanned beam positions;
h) repeating steps d) to g) till the beam angle profile meets a preset angle criteria.
i) determining the beam scanning velocity profiles based on ion beam intensity profiles; and
j) irradiating the substrate with the scanned ion beam with the preset Panofsky coil current values and beam scanning velocity profiles.

* * * * *